(12) United States Patent
Bedell et al.

(10) Patent No.: US 8,901,713 B2
(45) Date of Patent: Dec. 2, 2014

(54) EXTREMELY THIN SEMICONDUCTOR-ON-INSULATOR WITH BACK GATE CONTACT

(71) Applicant: International Business Machines Corporation, Armonk, NY (US)

(72) Inventors: Stephen W. Bedell, Wappingers Falls, NY (US); Bahman Hekmatshoartabari, White Plains, NY (US); Ali Khakifirooz, Mountain View, CA (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 13/678,111

(22) Filed: Nov. 15, 2012

(65) Prior Publication Data

US 2014/0103533 A1    Apr. 17, 2014

Related U.S. Application Data

(63) Continuation of application No. 13/651,874, filed on Oct. 15, 2012.

(51) Int. Cl.
*H01L 21/02* (2006.01)
(52) U.S. Cl.
USPC ............... 257/586; 257/E27.055; 257/550; 257/554; 257/773; 438/343
(58) Field of Classification Search
CPC ............................. H01L 29/732; H01L 21/00

USPC .......... 257/E23.011, E27.055, E27.057, 302, 257/550, 554, 586, 700, 743, 773; 438/343, 438/348
See application file for complete search history.

(56) References Cited

U.S. PATENT DOCUMENTS

| | | | | |
|---|---|---|---|---|
| 5,504,368 A | * | 4/1996 | Sawada .......................... | 257/556 |
| 5,656,547 A | * | 8/1997 | Richards et al. .............. | 438/460 |
| 6,593,628 B2 | * | 7/2003 | Dekker et al. ................ | 257/351 |
| 6,597,053 B1 | * | 7/2003 | Anthofer et al. .............. | 257/508 |
| 7,157,785 B2 | * | 1/2007 | Takei et al. ................... | 257/565 |
| 7,265,005 B2 | | 9/2007 | Nowak et al. | |
| 7,268,647 B2 | * | 9/2007 | Sano et al. .................... | 333/187 |

(Continued)

OTHER PUBLICATIONS

Khater. M., et al., "FDSOI CMOS with Dielectrically-Isolated Back Gates and 30nm LG High-k/Metal Gate", 2010 Symposium on VLSI Technology Digest of Technical Papers, Jun. 2010, pp. 43-44.

(Continued)

*Primary Examiner* — Chris Chu
(74) *Attorney, Agent, or Firm* — Scully, Scott, Murphy & Presser, P.C.; Louis J. Percello, Esq.

(57) ABSTRACT

A structure is provided in which the back gate regions are physically separated from one another as opposed to using reversed biased pn junction diodes. In the present disclosure, the back gate regions can be formed first through a buried dielectric material of an extremely thin semiconductor-on-insulator (ETSOI) substrate. After dopant activation, standard device fabrication processes can be performed. A semiconductor base layer portion of the ETSOI substrate can then be removed from the original ETSOI to expose a surface of the back gates.

11 Claims, 4 Drawing Sheets

(56) References Cited

U.S. PATENT DOCUMENTS

| | | | |
|---|---|---|---|
| 7,687,887 B1 * | 3/2010 | El-Diwany et al. | 257/565 |
| 8,012,812 B2 * | 9/2011 | Okazaki | 438/149 |
| 8,247,261 B2 | 8/2012 | Bedell et al. | |
| 8,669,135 B2 * | 3/2014 | Kao et al. | 438/74 |
| 2007/0051994 A1 | 3/2007 | Song et al. | |
| 2010/0032761 A1 | 2/2010 | Ding et al. | |
| 2010/0176482 A1 | 7/2010 | Dennard et al. | |
| 2010/0307572 A1 | 12/2010 | Bedell et al. | |
| 2010/0311250 A1 | 12/2010 | Bedell et al. | |
| 2012/0112309 A1 | 5/2012 | Dennard et al. | |
| 2012/0217561 A1 | 8/2012 | Khakifirooz et al. | |

OTHER PUBLICATIONS

Roy, K., et al., "Double-Gate SOI Devices for Low-Power and High-Performance Applications", Proceedings of the 19th International Conference on VLSI Design (VLSID'06), Jan. 3-7, 2006.

Office Action dated Sep. 13, 2013 received in parent U.S. Patent Application, namely U.S. Appl. No. 13/651,874.

\* cited by examiner

EXTREMELY THIN SEMICONDUCTOR-ON-INSULATOR WITH BACK GATE CONTACT

CROSS REFERENCE TO RELATED APPLICATION

This application is a continuation of U.S. patent application Ser. No. 13/651,874, filed Oct. 15, 2012 the entire content and disclosure of which is incorporated herein by reference.

BACKGROUND

The present disclose relates to a semiconductor structure and a method of forming the same. More particularly, the present disclosure relates to a dual gate extremely thin semiconductor-on-insulator (ETSOI) structure with back gate electrodes that are physically isolated, and a method of forming the ETSOI structure.

In order to be able to make integrated circuits (ICs), such as memory, logic, and other devices, of a higher integration density than is currently feasible, field effect transistor (FET) dimensions must be scaled down, as FETs are an important component of many ICs. However, as FET dimensions are scaled down, FETs may suffer from various problems. For example, interactions between the source and drain of the FET may degrade the ability to control whether the FET is on or off, which may result in memory or logic errors during IC operation. As the FET size is reduced, the distance between source and drain regions of the FET is decreased, leading to increased interaction with the channel by the source and drain, and reduced gate control of the channel. This phenomenon is referred to as the short channel effect. It becomes increasingly more difficult to control short channel effects by conventional techniques as FETs become smaller.

An evolution beyond the standard FET with a single top gate that controls the FET channel is the double-gated FET, wherein the channel is confined between a top and a bottom gate. Positioning the channel between a top and a bottom gate allows for control of the channel by the two gates from both sides of the channel, reducing short channel effects. Further, a double-gated FET may exhibit higher transconductance and reduced parasitic capacitance as compared to a single-gated FET. The presence of the back gate allows for enhanced on-chip power management and device tuning. Multiple threshold voltage (Vt) devices may also be achieved on a single IC chip by applying different back biases at the back gates of various devices.

SUMMARY

The present disclosure provides a method that substantially eliminates junction leakage at the back gate of an ETSOI device and, in some embodiments, can enable ETSOI technology with a thin buried dielectric material layer. The present disclosure also provides a method that can eliminate the need for a double shallow trench isolation (STI) process with one shallow trench isolating devices and a deep trench isolating the back gates. In addition, a structure is provided in which the back gate regions are physically separated from one another as opposed to using reversed biased pn junction diodes. In the present disclosure, the back gate regions can be formed first through a buried dielectric material of an ETSOI substrate. After dopant activation, standard device fabrication processes can be performed. A semiconductor base layer portion of the ETSOI substrate can then be removed from the original ETSOI to expose a surface of the back gates.

In one aspect of the present disclosure, a method of forming a dual gate extremely thin semiconductor-on-insulator (ETSOI) structure is provided. The method of the present disclosure includes forming non-contiguous first conductivity type semiconductor regions within a semiconductor base layer of a semiconductor-on-insulator substrate, wherein a gap is present between each non-contiguous first conductivity type semiconductor region, and wherein the semiconductor-on-insulator substrate further comprises at least one buried dielectric material layer located on a surface of the semiconductor base layer, and a semiconductor-on-insulator layer located on an uppermost surface of the at least one buried dielectric material layer. Next, the semiconductor-on-insulator layer is patterned forming at least a first active device region and a second active device region. In accordance with the present disclosure, the first active device region is located above one of the non-contiguous first conductivity type semiconductor regions and the second active device region is located atop another of the non-contiguous first conductivity type semiconductor regions, and wherein the first and second active device regions are both vertically offset from the gap. A first transistor is then formed within the first active device region and a second transistor is also formed within the second active device region. Next, an interconnect structure is formed straddling each of the transistors. The semiconductor base layer of the semiconductor-on-insulator substrate is then removed stopping on a surface of each of the non-contiguous first conductivity type semiconductor regions and a surface of the at least one buried dielectric material.

In another aspect of the present disclosure, a dual gate extremely thin semiconductor-on-insulator (ETSOI) structure is provided. The dual gate extremely thin semiconductor-on-insulator (ETSOI) structure of the present disclosure includes at least one buried dielectric material layer having a first surface and a second surface opposing the first surface. The structure further includes non-contiguous first conductivity type semiconductor regions located on the first surface of the at least one buried dielectric material layer, wherein a cavity is present between each non-contiguous first conductivity type semiconductor region. The structure further includes a first active device region and a second active device region located on the second surface of the at least one buried dielectric material layer. The first and second active device regions are isolated from each other and are vertically offset from the cavity. The structure even further includes a first transistor located within the first active device region and a second transistor located within the second active device region.

DETAILED DESCRIPTION

Figure 1:
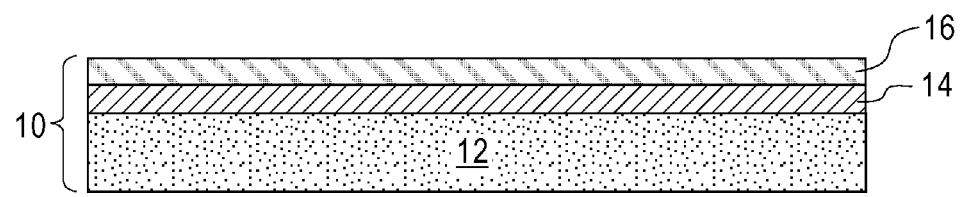
FIG. 1 is a pictorial representation (through a cross sectional view) illustrating an extremely thin semiconductor-on-insulator (ETSOI) substrate including, from bottom to top, a semiconductor base layer, at least one buried dielectric material layer, and a semiconductor-on-insulator (SOI) layer that can be employed in some embodiments of the present disclosure.

The present disclosure, which relates to a dual gate extremely thin semiconductor-on-insulator (ETSOI) structure with back gate electrodes that are physically isolated, and a method of forming the ETSOI structure, will now be described in greater detail by referring to the following discussion and drawings that accompany the present application.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Back gate ETSOI structures are one of the most promising options for low power applications. Back gates are typically formed by implanting a region of the substrate below a buried dielectric material layer at the beginning of the device processes and are isolated by shallow trench isolation (STI) and pn junctions. A double-buried dielectric material layer process has been proposed which isolates the back gates entirely with dielectrics (STI and buried dielectric material), however, such a process requires a double-depth STI process such that the back gate can be shared by any number of transistors.

In both of the above mentioned techniques, the need to use an STI process is a yield challenge. Moreover, divots can form at the STI edge, which might lead to shorts between the top layers (eptiaxy, silicide or contact) and the back gate. In view of the above, a simple method of forming a back gate that does not include an STI process is needed. The present disclosure provides such a method which is now described in greater detail.

Referring first to FIG. 1, there is illustrated an extremely thin semiconductor-on-insulator (ETSOI) substrate 10 that can be employed in some embodiments of the present disclosure. The term "extremely thin semiconductor-on-insulator (ETSOI) substrate" as used throughout the present disclosure denotes a semiconductor-on-insulator substrate having a semiconductor-on-insulator (SOI) layer whose thickness is from 2 nm to 30 nm. The SOI layer is the uppermost semiconductor layer of the ETSOI substrate in which semiconductor devices such as transistors are typically formed.

As shown, the ETSOI substrate 10 that can be employed in the present disclosure includes, from bottom to top, a semiconductor base layer 12, at least one buried dielectric material layer 14 located on an uppermost surface of the semiconductor base layer 12, and a semiconductor-on-insulator (SOI) layer 16 located on the uppermost surface of the at least one buried dielectric material layer 14. As shown, a bottommost surface of the at least one buried dielectric material layer 14 forms a first interface with the uppermost surface of the semiconductor base layer 12, and the uppermost surface of the at least one buried dielectric material layer 14 forms a second interface with a bottommost surface of the SOI layer 16.

Each of the semiconductor base layer 12 and the SOI layer 16 of the ETSOI substrate 10 includes a semiconductor material independently selected from elemental semiconductor materials (e.g., silicon, germanium, carbon, or alloys thereof), III-V semiconductor materials, or II-VI semiconductor materials. Each semiconductor material for the semiconductor base layer 12 and the SOI layer 16 can be independently single crystalline, polycrystalline, or amorphous. In some embodiments of the present disclosure, the SOI layer 16 may include a same semiconductor material as that of the semiconductor base layer 12. In other embodiments of the present disclosure, the SOI layer 16 may include a different semiconductor material as that of the semiconductor base layer 12. In one embodiment, the semiconductor base layer 12 and the SOI layer 16 are single crystalline semiconductor materials. In another embodiment, the semiconductor base layer 12 and the SOI layer 16 both comprise single crystalline silicon. In yet another embodiment, the single crystalline silicon may contain Ge atoms or C atoms.

In some embodiments, the semiconductor base layer 12 and/or the SOI layer 16 is/are intrinsic semiconductor material(s). By "intrinsic" it is meant that the semiconductor material is undoped or contains a dopant concentration of less than $1 \times 10^{17}$ atoms/cm$^3$. In other embodiments, the semiconductor base layer 12 and/or the SOI layer 16 is/are doped semiconductor material(s) containing either a p-type dopant or an n-type dopant. In cases in which the semiconductor base layer 12 is doped, the dopant (n-type or p-type) is present within the semiconductor base layer 12 at a concentration from greater than $1 \times 10^{17}$ atoms/cm$^3$ up to $1 \times 10^{18}$ atoms/cm$^3$. At such a dopant concentration, the semiconductor base layer 12 may be referred to a lightly doped semiconductor base layer of a first conductivity type (either n-type or p-type).

The at least one buried dielectric material layer 14 includes at least one dielectric material such as, for example, silicon dioxide, silicon nitride, boron nitride, a dielectric metal oxide (including metal oxides having a dielectric constant of greater than 3.9), or a combination thereof. In some embodiments of the present disclosure, the at least one buried dielectric material layer 14 includes a single material layer such as, for example, a silicon dioxide layer. In another embodiment, the at least one buried dielectric material layer 14 is a multilayered stack of insulator materials including, for example, a stack of silicon dioxide and a dielectric metal oxide.

The first thickness of the at least one buried dielectric material layer 14 can be from 2 nm to 3 microns and the thickness of the semiconductor base layer 12 can be from 50 microns to 2 mm, although lesser and greater thicknesses can also be employed for the at least one buried dielectric material layer 14 and the semiconductor base layer 12.

In some embodiments of the present disclosure, the ETSOI substrate 10 can be formed by implanting a high-energy dopant such as, for example, oxygen into a bulk semiconductor substrate and then annealing the structure to form the at least one buried insulator material layer 14. In other embodiments of the present disclosure, the ETSOI substrate 10 can be formed by first depositing or growing at least one dielectric material layer on an upper surface of a bulk semiconductor substrate and thereafter forming a semiconductor material layer on the at least one dielectric material layer. In still other embodiments of the present disclosure, the ETSOI substrate 10 can be formed using wafer-bonding techniques, where a bonded wafer pair including at least one dielectric material layer is formed utilizing glue, adhesive polymer, or direct bonding.

In some embodiments, and when the SOI layer is not within the thickness range of 2 nm to 30 nm, an optional thinning step can be used to thin the SOI layer to have a thickness within the range of 2 nm to 30 nm. When an optional thinning step is employed, the optional thinning step may include planarization, grinding, wet etching, dry etching, oxidation followed by an oxide etch, or any combination thereof. One method of thinning a SOI layer is to oxidize silicon (Si) by a thermal dry or wet oxidation process, and then wet etch the oxide layer using a hydrofluoric acid mixture. This process can be repeated to achieve the desired thickness.

Figure 2:
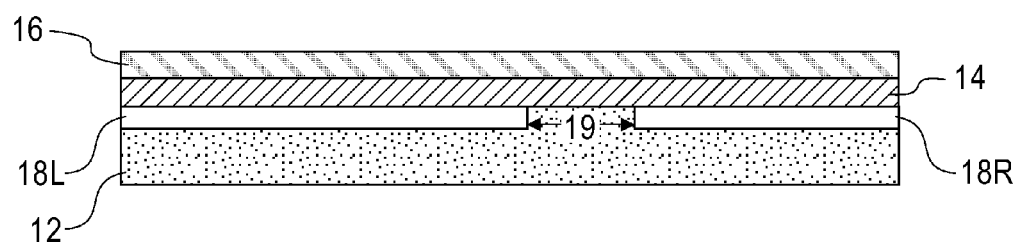
FIG. 2 is a pictorial representation (through a cross sectional view) illustrating the structure of FIG. 1 after forming non-contiguous first conductivity type semiconductor regions within the semiconductor base layer, wherein each non-contiguous first conductivity type semiconductor region has an uppermost surface in direct contact with a bottommost surface of the at least one buried dielectric material layer.

Referring now to FIG. 2, there is illustrated the structure of FIG. 1 after forming non-contiguous first conductivity type semiconductor regions 18L, 18R within the semiconductor base layer 12. It is noted that the non-contiguous first conductivity type semiconductor regions 18L, 18R function as back gates for the structure of the present disclosure. As such, the non-contiguous first conductivity type semiconductor regions 18L, 18R can also be referred to here as back gates or back gate regions. It is noted that the present disclosure is not limited to forming only two non-contiguous first conductivity type semiconductor regions 18L, 18R within the semiconductor base layer 12, instead a plurality of non-contiguous first conductivity type semiconductor regions can be formed, each of which can be used as a back gate of a dual gated transistor.

As shown in FIG. 2, each non-contiguous first conductivity type semiconductor region 18L, 18R has an uppermost surface in direct contact with a bottommost surface of the at least one buried dielectric material layer 14. Also, gap 19 is present between the adjacent non-contiguous first conductivity type semiconductor regions 18L, 18R as such the adjacent non-contiguous first conductivity type semiconductor regions 18L, 18R are spaced apart, i.e., physically separated from each other.

The non-contiguous first conductivity type semiconductor regions 18L, 18R are formed by first providing a patterned implantation mask (not shown) atop the SOI layer 16. The patterned implantation mask protects at least one portion of the SOI layer 16, while leaving other portions of the SOI layer 16 exposed.

The patterned implantation mask may include a mask material such as, for example, a hard mask material (i.e., an oxide, nitride, and/or oxynitride), a photoresist material or a multilayered stack thereof including, for example a stack of, from bottom to top, a hard mask material and a photoresist material. The patterned implantation mask can be provided by depositing at least one blanket layer of mask material atop the SOI layer 16, Next, and, if not present as the topmost layer of the at least one blanket layer of mask material, a photoresist material can be formed atop the at least one blanket layer of mask material. The photoresist material is then exposed to a desired pattern of radiation, and then the exposed resist is developed utilizing a conventional resist developer. The pattern from the patterned photoresist can then be transferred into the at least one blanket layer of mask material by etching.

The etching may include a dry etching process such as, for example, reactive ion etching, plasma etching, ion etching or laser ablation. The etching may further include a wet chemical etching process in which one or more chemical etchants are used to remove portions of the blanket layer of mask material that are not protected by the patterned photoresist. In some embodiments, the patterned photoresist can be removed after pattern transfer, but prior to forming the non-contiguous first conductivity type semiconductor regions 18L, 18R utilizing an ashing process. In other embodiments, the patterned photoresist can be removed after pattern transfer, but prior to forming the non-contiguous first conductivity type semiconductor regions 18L, 18R utilizing an ashing process.

After forming the patterned implantation mask atop the SOI layer 16, dopants of a first conductivity type (i.e., n-type dopants or p-type dopants) can be introduced in the semiconductor base layer 12 by ion implantation. Following the ion implantation, the implantation mask is removed from the structure utilizing conventional techniques well known to those skilled in the art. As used herein, "p-type" refers to the addition of impurities to an intrinsic semiconductor that creates deficiencies of valence electrons. Illustrative examples of p-type conductivity type dopants include elements from Group IIIA of the Periodic Table of Elements, e.g., boron, aluminum, gallium and/or indium. As used herein, "n-type" refers to the addition of impurities that contributes free electrons to an intrinsic semiconductor. Illustrative examples of n-type conductivity type dopants include elements from Group VA of the Periodic Table of Elements; e.g., antimony, arsenic and/or phosphorous. In one embodiment, the concentration of dopant in each non-contiguous first conductivity type semiconductor region 18L, 18R may range from $1\times10^{18}$ atoms/cm$^3$ to $2\times10^{21}$ atoms/cm$^3$.

In embodiments in which the semiconductor base layer 12 was previously doped, dopants of a first conductivity type are selected for the formation of the non-contiguous first conductivity type semiconductor regions 18L, 18R which match the dopant type of the previously doped semiconductor base layer 12. In such a case, the non-contiguous first conductivity type semiconductor regions 18L, 18R comprise a same conductivity type dopant as the previously doped semiconductor base layer 12, however the non-contiguous first conductivity type semiconductor regions 18L, 18R contain a higher concentration of the first conductivity type dopants than the previously doped semiconductor base layer 12.

In one embodiment, the semiconductor base layer 12 is intrinsic and each of the non-contiguous first conductivity type semiconductor regions 18L, 18R includes p-type dopants therein. In one embodiment, the semiconductor base layer 12 is doped with a p-type dopant, and each of the non-contiguous first conductivity type semiconductor regions 18L, 18R includes p-type dopants therein, wherein the concentration of the p-type dopants within each of the non-contiguous first conductivity type semiconductor regions 18L, 18R is greater than the p-type dopants within the original semiconductor base layer 12. An anneal may be used to activate the dopants within each of the non-contiguous first conductivity type regions 18L, 18R.

Figure 3:
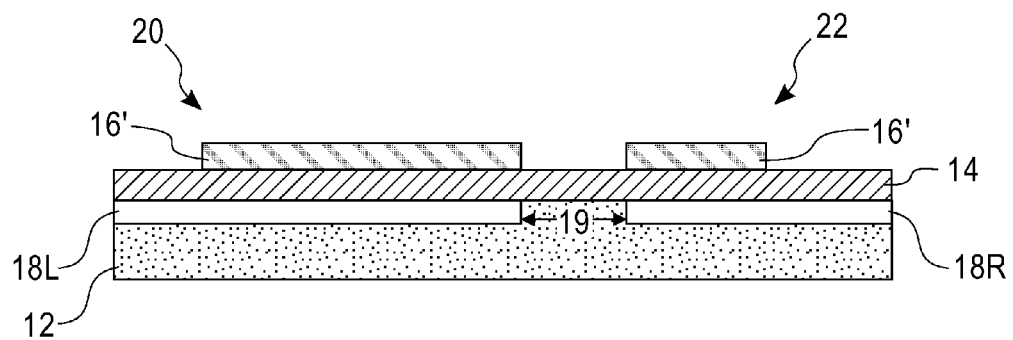
FIG. 3 is a pictorial representation (through a cross sectional view) illustrating the structure of FIG. 2 after patterning the SOI layer forming a first active device region and a second active device region that are isolated from each other.

Referring now to FIG. 3, there is illustrated the structure of FIG. 2 after patterning the SOI layer 16 forming a first active device region 20 and a second active device region 22 that are isolated from each other. It is noted that although two separate device regions are shown and described herein, the present disclosure is not limited to forming only two device regions. Instead, the present disclosure can form a plurality of device regions atop the at least one buried dielectric material layer 14. As shown, each active device region 20, 22 is vertically offset from the gap 19. That is, no portion of the active device regions 20, 22 extends directly above the gap 19. In some cases, a sidewall edge of at least one of the active device regions 20, 22 is vertically coincident with a sidewall surface of the gap 19.

Each active device region 20, 22 includes remaining portions of the SOI layer 16' (the remaining portions of the SOI layer can also be referred to herein as patterned SOI portions 16'). The patterning of the SOI layer 16 can be performed by photolithography and etching. The photolithographic process includes applying a blanket layer of a photoresist material (not shown) atop the SOI layer 16 utilizing a conventional deposition process such as, for example, chemical vapor deposition, plasma enhanced chemical vapor deposition, evaporation, and spin-on coating. After forming the blanket layer of photoresist material, the blanket layer of photoresist material is exposed to a desired pattern of radiation and thereafter the exposed resist is developed using a conventional developer. The lithography step provides a patterned photoresist atop the SOI layer 16. An etching step is then used to transfer the pattern from the patterned photoresist into the SOI layer 16. The etching may include a dry etching process such as, for example, reactive ion etching, plasma etching, ion etching or laser ablation. The etching may further include a wet chemical etching process in which one or more chemical etchants are used to remove portions of the blanket layers that are not protected by the patterned photoresist. The patterned photoresist can be removed after patterning the SOI layer 16 utilizing an ashing process.

Figure 4:
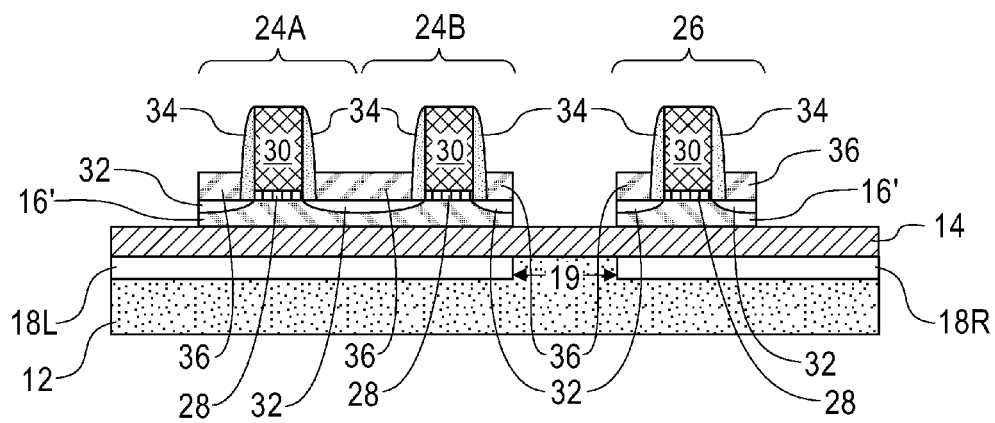
FIG. 4 is a pictorial representation (through a cross sectional view) illustrating the structure of FIG. 3 after forming at least one first transistor within the first active device region and at least one second transistor with the second active device region.

Referring now to FIG. 4, there is illustrated the structure of FIG. 3 after forming a pair of first transistors 24A and 24B within the first active device region 20 and a second transistor 26 within the second active device region 22. Although a pair of first transistors are shown in the first active device region and a single second transistor is shown in the second active device region, the present disclosure is not limited to those exact numbers of transistors within the various devices regions. Instead, any number of transistors can be formed.

The pair of first transistors 24A and 24B within the first active device region 20 and the second transistor 26 within the second active device region 22 each include at least one gate dielectric material 28 and a gate electrode 30. Each of the transistors 24A, 24B and 26 also includes a source region and a drain region collectively referred to herein as a source/drain regions 32 located within the patterned SOI portions 16' of the respective active device region 20, 22. Each transistor 24A, 24B and 26 can also include a dielectric spacer 34 located on an exposed sidewall surface of at least the gate electrode 30. Also present are raised source/drain regions 36 which are located atop portions of the source/drain regions 32.

The at least one gate dielectric material 28 can be comprised of a semiconductor oxide, semiconductor nitride, semiconductor oxynitride, or any multilayered stack thereof. In one example, the at least one gate dielectric material 28 can be comprised of a semiconductor oxide such as, for example, silicon dioxide. The at least one gate dielectric material 28 can also be comprised of a dielectric metal oxide having a dielectric constant that is greater than the dielectric constant of silicon dioxide, e.g., 3.9. In one embodiment, the at least one gate dielectric material 28 can comprise a dielectric oxide having a dielectric constant greater than 4.0. In another embodiment, the at least one gate dielectric material 28 can be comprised of a dielectric oxide having a dielectric constant of greater than 8.0. Exemplary dielectric oxide materials which have a dielectric constant of greater than 3.9 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed as the at least one gate dielectric material 28. For example, the at least one gate dielectric material 28 can include a stack of, from bottom to top, silicon dioxide and hafnium oxide. In some embodiments, the at least one gate dielectric material 28 of transistors 24A and 24B are different from the at least one gate dielectric material 28 of transistor 26. In other embodiments, the at least one gate dielectric material 28 of transistors 24A and 24B are the same as the at least one gate dielectric material 28 of transistor 26.

The thickness of the at least one gate dielectric material 28 of each transistor 24A, 24B and 26 may vary depending on the technique used to form the same. In some embodiments, the thickness of the at least one gate dielectric material 28 of transistors 24A and 24B is different from the thickness of the at least one gate dielectric material 28 of transistor 26. In other embodiments, the thickness of the at least one gate dielectric material 28 of transistors 24A and 24B is the same as the thickness of the at least one gate dielectric material 28 of transistor 26. Notwithstanding which embodiment is employed in the present disclosure, the thickness of the at least one gate dielectric material 28 of each transistor 24A, 24B and 26, which can be referred to herein as a second thickness, is less than the 'first' thickness of the at least one buried dielectric material layer 14. Typically and in one embodiment, the at least one gate dielectric material 28 has a thickness from 0.5 nm to 10 nm. In another embodiment, the at least one gate dielectric material 28 has a thickness from 1.0 nm to 5 nm. In yet other embodiments of the present disclosure, the at least one gate dielectric material 28 may have an effective oxide thickness on the order of, or less than, 2 nm.

The at least one gate dielectric material 28 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the at least one gate dielectric material 28 can be formed utilizing a thermal process such as, for example thermal oxidation or thermal nitridation. Block mask technology may be used to form different types of gate dielectrics within the different device regions.

The gate electrode 30 of the pair of first transistors 24A and 24B within the first active device region 20 and of second transistor 26 within the second active device region 22 can comprise any conductive metal-containing material including, but not limited to, doped polysilicon, doped SiGe, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayers thereof. In some embodiments, the gate electrode 30 includes, from bottom to top, a conductive metal and doped polysilicon. In some embodiments, the gate electrode 30 of transistors 24A and 24B are different from the gate electrode 30 of transistor 26. In other embodiments, the gate electrode 30 of transistors 24A and 24B are the same as the gate electrode 30 of transistor 26.

The gate electrode 30 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When a metal silicide is formed, a conventional silicidation process can be employed. When a Si-containing material is employed as the gate electrode 30, a non-doped Si-containing layer can be formed and thereafter a dopant can be introduced into the non-doped Si-containing layer by utilizing one of ion implantation, gas phase doping, or by transferring a dopant from a sacrificial material layer formed in proximity of the non-doped Si-containing layer, and then removing the sacrificial layer from the structure. Alternatively, a doped Si-containing layer can be formed utilizing an in-situ doping deposition process.

The transistors 24A, 24B and 26 can be formed utilizing any conventional process including, for example, a gate first or a gate last, i.e., replacement gate process. So as not to obscure the present disclosure, the details of such processes are not described herein.

The source/drain regions 32 can be formed utilizing any conventional ion implantation process. The source/drain regions 32 include n-type dopants or p-type dopants as are well known to one skilled in the art. The dielectric spacer 34 can be comprised of a dielectric oxide, such as for example, silicon dioxide, and/or an oxygen-impermeable dielectric material such as silicon nitride, or a dielectric metallic nitride. The dielectric spacer 34 can be formed by deposition, followed by etching.

The raised source/drain regions 36 which are located atop portions of the source/drain regions 32 can be formed utilizing an epitaxial growth process. Doping of the raised source/drain regions 36 may incur in-situ (i.e., during the epitaxial growth process) or after the epitaxial growth process by utilizing one of ion implantation, gas phase doping or out-diffusion of a dopant from a sacrificial dopant-containing material. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. In the present embodiment, the semiconductor material which forms the raised source/drain regions 36 has the same crystalline characteristics as that of exposed surface of each active device 20, 22, i.e., the crystalline characteristics of the upper surface of the remaining portion of the SOI layer 16'. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process.

The semiconductor material that forms the raised source/drain regions 36 includes any semiconductor material such as, for example, silicon (Si), germanium (Ge), and silicon germanium (SiGe). In one embodiment, the semiconductor material that forms the raised source/drain regions 36 includes a same semiconductor material as that of the SOI layer 16. In another embodiment, the semiconductor material that forms the raised source/drain region 36 includes a different semiconductor material as that of the SOI layer 16. It is noted that the specific material compositions for the semiconductor material that forms the raised source/drain regions 36 are provided for illustrative purposes only, and are not intended to limit the present disclosure, as any semiconductor material may be formed using an epitaxial growth process.

A number of different sources may be used for the deposition of the semiconductor material that forms the raised source/drain regions 36. In some embodiments, in which the semiconductor material that forms the raised source/drain regions 36 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that forms the raised source/drain regions 36 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the raised source/drain region 36 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial semiconductor deposition typically ranges from 150° C. to 900° C. Although higher temperature typically results in faster deposition, the faster deposition may result in crystal defects and film cracking. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. In some embodiments, n-type dopants or p-type dopants can be present within the gas sources described above.

In some embodiments, an upper portion or the entirety of the raised source/drain regions 36 can be converted into a metal semiconductor alloy utilizing a conventional silicidation process. In one example, the silicidation process includes forming a metal which is capable of reacting with a semiconductor material, such as, for example, Ni, W, Pt, and Co, on an exposed surface of the raised source/drain regions 36, and then subjecting the structure to an anneal. During the anneal, metal atoms diffuse into the raised source/drain regions 36, and subsequently react with the semiconductor atoms forming a metal semiconductor alloy. After annealing, any non-reacted metal can be removed by etching.

Figure 5:
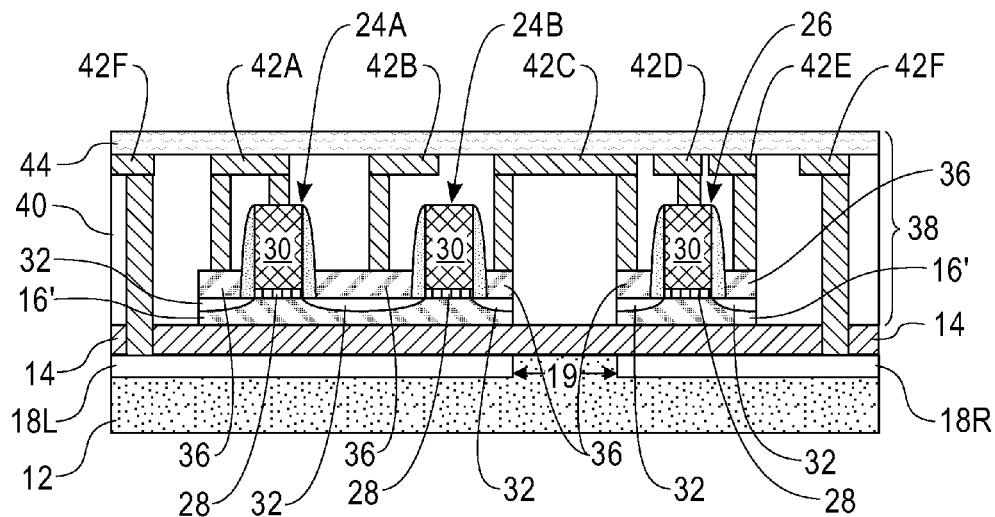
FIG. 5 is a pictorial representation (through a cross sectional view) illustrating the structure of FIG. 4 after forming an interconnect structure which includes at least one dielectric material having metal contacts embedded therein.

Referring now to FIG. 5, there is illustrated the structure of FIG. 4 after forming an interconnect structure 38 which includes at least one dielectric material 40 having metal contacts 42A, 42B, 42C, 42D and 42E embedded therein. A dielectric cap 44 can be located on an uppermost surface of the at least one dielectric material 40 as well as the uppermost surface of some of the metal contacts. Although the specific metal contact scheme of FIG. 5 is described and illustrated, the present disclosure can use other contact schemes which can be designed by one skilled in the art.

The metal contacts 42A, 42B, 42C, 42D, 42E and 42F can be in the form of trench, a via or a combination of a trench and via. In the drawings, and for illustrative purposes only, each metal contact 42A, 42B, 42C, 42D, 42E and 42F is shown as a combined trench and via. In some embodiments and as shown in FIG. 5, metal contacts 42F can be formed such that metal contacts 42F are in direct contact with a surface of one of the non-contiguous first conductivity type semiconductor regions. As also shown, the interconnect structure straddles each transistor 24A, 24B and 26 within the different active device regions.

The interconnect structure 38 can be formed utilizing any back-end-of-the-line process including, for example, a single damascene or a dual damascene process. The at least one dielectric material 40 comprises an interconnect dielectric material including, for example, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The at least one dielectric material 40 can be porous or non-porous. In one embodiment, at least one dielectric material 40 has a dielectric constant that is about 4.0 or less. In another embodiment, at least one dielectric material 40 has a dielectric constant of about 2.8 or less. All dielectric constants mentioned herein are relative to a vacuum, unless otherwise noted.

The metal contacts 42A, 42B, 42C, 42D, 42E and 42F are comprised of a conductive metal such as, for example, Cu, W, Al, and alloys thereof. The metal is formed into previously formed contact openings via a deposition process including, for example, chemical vapor deposition, plasma enhanced chemical vapor deposition, sputtering, and plating.

The metal contacts 42A, 42B, 42C, and 42E provide electrical contact (and in some cases physically contact) with some of the elements of the transistors 24A, 24B and 26. For example, metal contact 42A provides electrically contact between the gate electrode 30 of transistor 24A with one of the raised source/drain regions 36 of transistor 24A. Metal contact 42B forms a contact with another of the raised source/drain regions 26 of transistor 24A. In the illustrated embodiment, transistors 24A and 24B share a common source/drain region 32 and a common raised source/drain region 36. Metal contact 42C connects another of the raised source/drain regions 26 of transistors 24B to the raised source drain region 36 of transistor 26. Metal contact 42D contacts the gate electrode 30 of transistor 26, while metal contact 42E contacts the other raised source/drain region of 36 transistor 26.

The optional dielectric cap 44 comprises any suitable dielectric cap material such as, for example, SiC, $Si_4NH_3$, $SiO_2$, a carbon doped oxide, a nitrogen and hydrogen doped silicon carbide SiC(N,H) or multilayers thereof. Any conventional deposition process such as, for example, chemical vapor deposition, plasma enhanced chemical vapor deposition, chemical solution deposition, evaporation, and atomic layer deposition may be used in forming the optional dielectric cap 44.

Figure 6:
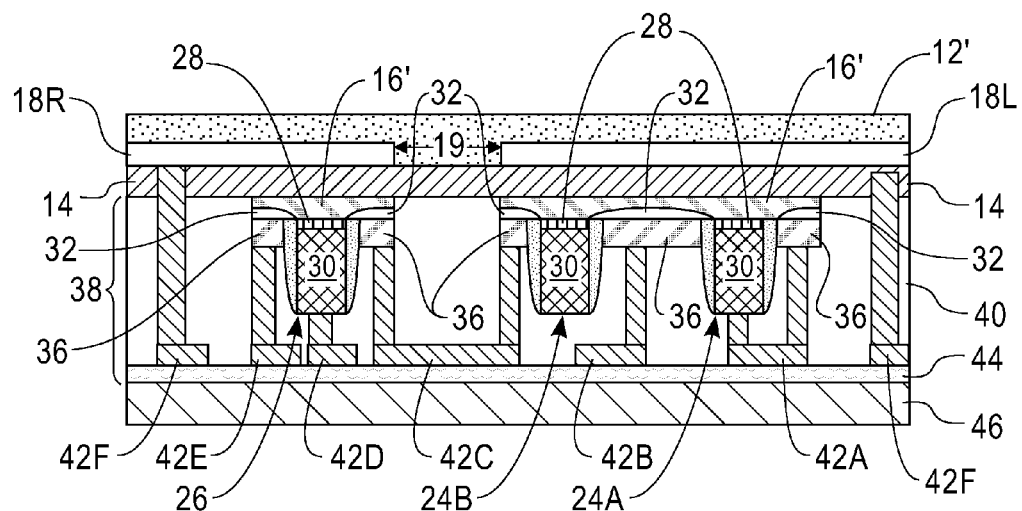
FIG. 6 is a pictorial representation (through a cross sectional view) illustrating the structure of FIG. 5 after removing a portion of the semiconductor base layer of the original ETSOI substrate by spalling.

Reference is now made to FIG. 6, which illustrates the structure of FIG. 5 after removing a portion of the semiconductor base layer 12 of the original ETSOI substrate 10; FIG. 6 and the remaining drawings are rotated 180° from the structures depicted in FIGS. 1-5. In one embodiment, spalling is used to remove a portion of the semiconductor base layer.

In lieu of spalling, a standard etching process, and/or a planarization process, such as chemical mechanical polishing and/or grinding can be used for removing a portion of the semiconductor base layer. It is noted that the present disclosure is not limited to the aforementioned methods for removing at least a portion of the semiconductor base layer. Instead, other methods can be used to remove at least a portion of the semiconductor base layer. In some of the methods, a handle wafer can be bonded to the semiconductor base layer 12 prior to removing a portion of the semiconductor base layer.

When spalling is employed, at least a stressor layer 46 is formed on the exposed surface of the interconnect structure 38. In some embodiments (not shown), an optional metal-containing adhesion layer can be formed on exposed surface of the interconnect structure 38 prior to forming stressor layer 46 so as to improve the adhesion of the stressor layer 46 to the exposed surface of the interconnect structure 38. Typically, the optional metal-containing adhesion layer is employed when a stressor layer 46 comprised of a metal is employed. In some embodiments, an optional plating seed layer (also not shown) can be formed directly atop exposed surface of the interconnect structure 38 prior to forming the stressor layer 46. In other embodiments, both optional layers, i.e., a metal-containing adhesion layer and a plating seed layer can be used and formed prior to the stressor layer 46.

The optional metal-containing adhesion layer that may be employed in the present disclosure includes any metal adhesion material such as, but not limited to, Ti/W, Ti, Cr, Ni or any combination thereof. The optional metal-containing adhesion layer may comprise a single layer or it may include a multi-layered structure comprising at least two layers of different metal adhesion materials.

The metal-containing adhesion layer, which may be optionally employed, can be formed utilizing deposition techniques that are well known to those skilled in the art. For example, the optional metal-containing adhesion layer can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

The optional metal-containing adhesion layer and/or the optional plating seed layer is (are) formed at a temperature which does not effectuate spontaneous spalling to occur within the semiconductor base layer 12. By "spontaneous" it is meant that the removal of a thin material layer from the semiconductor base layer 12 occurs without the need to employ any manual means to initiate crack formation and propagation for breaking apart a thin material layer from the semiconductor base layer 12. By "manual" it is meant that crack formation and propagation are explicit for breaking apart the thin material layer from the semiconductor base layer 12.

Stressor layer 46 that can be employed in the present disclosure includes any material that is under tensile stress at the spalling temperature. As such, the stressor layer 46 can also be referred to herein as a stress-inducing layer. In accordance with the present disclosure, the stressor layer 46 has a critical thickness and stress value that cause spalling mode fracture to occur within the semiconductor base layer 12. By "spalling mode fracture" it is meant that a crack is formed within semiconductor base layer 12 and the combination of loading forces maintain a crack trajectory at a depth below the uppermost surface of the semiconductor base layer 12. By "critical condition", it is meant that for a given stressor material and semiconductor base material combination, a thickness value and a stressor value for the stressor layer is chosen that render spalling mode fracture possible. The spalling process, conditions for spalling, and materials for spalling can include those mentioned within co-pending and commonly owned U.S. Patent Application Publication Nos. 2010/0307572, and 2010/0311250, the entire contents of which are incorporated herein by reference.

Illustrative examples of materials that are under tensile stress when applied atop the semiconductor base layer 12 and thus can be used as the stressor layer 46 include, but are not limited to, a metal, a polymer, such as a spall inducing tape layer, or any combination thereof. The stressor layer 46 may comprise a single stressor material, or a multilayered stressor structure including at least two layers of different stressor material can be employed. In one embodiment, the stressor layer 46 is a metal. In another embodiment, the stressor layer 46 is a spall inducing tape. In another embodiment, for example, the stressor layer 46 may comprise a two-part stressor layer including a lower part and an upper part. The upper part of the two-part stressor layer can be comprised of a spall inducing tape layer.

When a metal is employed as the stressor layer 46, the metal can include, for example, Ni, Cr, Fe, and/or W. Alloys of these metals can also be employed. In one embodiment, the stressor layer 46 includes at least one layer consisting of Ni.

When a polymer is employed as the stressor layer 46, the polymer is a large macromolecule composed of repeating structural units. These subunits are typically connected by covalent chemical bonds. Illustrative examples of polymers that can be employed as the stressor layer 46 include, but are not limited to, polyimides polyesters, polyolefins, polyacrylates, polyurethane, polyvinyl acetate, and polyvinyl chloride.

When a spall inducing tape layer is employed as the stressor layer 46, the spall inducing tape layer includes any pressure sensitive tape that is flexible, soft, and stress free at a first temperature used to form the tape, yet strong, ductile and tensile at a second temperature used during spalling. By "pressure sensitive tape," it is meant an adhesive tape that will stick with application of pressure, without the need for solvent, heat, or water for activation. Tensile stress in the tape at the second temperature is primarily due to thermal expansion mismatch between the semiconductor base layer 12 (with a lower thermal coefficient of expansion) and the tape (with a higher thermal expansion coefficient).

Typically, the pressure sensitive tape that can be employed in the present disclosure includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment and when the stressor layer 46 is a metal or polymer, the stressor layer 46 can be formed by a deposition process such as, for example, dip coating, spin-coating, brush coating, sputtering, chemical vapor deposition, plasma enhanced chemical vapor deposition, chemical solution deposition, physical vapor deposition, and/or plating. When the stressor layer 46 is a spall inducing tape layer, the spall inducing tape layer can be applied by hand or mechanical means.

If the stressor layer 46 is of a metallic nature, it typically has a thickness within a range from 3 μm to 50 μm, with a thickness within a range from 4 μm to 10 μm being more typical. Other thicknesses for a metallic stressor material that are below and/or above the aforementioned thickness ranges can also be employed in the present disclosure. If the stressor layer 46 is of a polymeric nature, it typically has a thickness in a range from 10 μm to 200 μm, with a thickness within a range from 50 μm to 100 μm being more typical. Other thicknesses for a polymeric stressor material that are below and/or above the aforementioned thickness ranges can also be employed in the present disclosure.

After forming the stressor layer 46, a flexible handle layer (not shown) can be formed on an exposed surface of the stressor layer 46. In some embodiments, the flexible handle layer may be omitted. The flexible handle layer employed in the present disclosure comprises any flexible material which has a minimum radius of curvature that is typically less than 30 cm. Illustrative examples of flexible materials that can be employed as the flexible handle layer include a metal foil or a polyimide foil. Alternatively, a tape as described above can be used as the flexible handle layer. The flexible handle layer can be used to provide better fracture control and more versatility in handling the spalled portion of the semiconductor base layer 12. Moreover, the flexible handle layer can be used to guide the crack propagation during spalling. The flexible handle layer of the present disclosure is typically, but not necessarily, formed at a first temperature which is at room temperature (15° C.-40° C.). The flexible handle layer typical has a thickness of from 1 μm to few mm, with a thickness of from 70 μm to 120 μm being more typical. Other thicknesses for the flexible handle layer that are below and/or above the aforementioned thickness ranges can also be employed in the present disclosure.

Next, a controlled spalling process can be performed in which a portion of the semiconductor base layer 12 is removed. The portion of the semiconductor base layer 12 which is no longer attached to the at least one buried dielectric material layer 14 can be referred to as herein as a non-spalled portion of semiconductor base layer. The portion of the semiconductor base layer 12 that remains attached to the at least one buried dielectric material layer 14 can be referred to herein as a spalled semiconductor base material layer, which is designated by reference numeral 12' in FIG. 6.

In one embodiment of the present disclosure, the spalled semiconductor base material layer 12' that can remain attached to the at least one buried dielectric material layer 14 can have a thickness of less than 100 microns. In another embodiment, the spalled semiconductor base material layer 12' that can remain attached to the at least one buried dielectric material layer 14 can have a thickness of less than 50 microns.

Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas. When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

Figure 7:
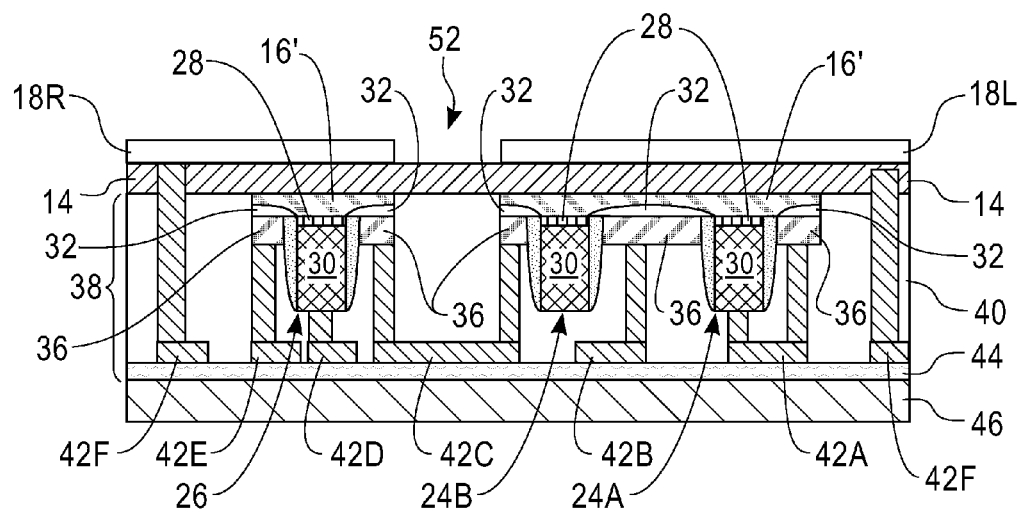
FIG. 7 is a pictorial representation (through a cross sectional view) illustrating the structure of FIG. 6 after removing a remaining portion of the semiconductor base layer stopping on a surface of each of the non-contiguous first conductivity type semiconductor regions and providing a cavity that exposes a surface of a portion of the at least one buried material layer.

Referring now to FIG. 7, there is illustrated the structure of FIG. 6 after removing a remaining portion of the spalled semiconductor base material layer 12' stopping on a surface of each of the non-contiguous first conductivity type semiconductor regions 18L, 18R and a surface of the at least one buried dielectric material layer 14. As shown, a cavity 52 is formed between each of the non-contiguous first conductivity type semiconductor regions 18L, 18R. Cavity 52 exposes a surface of the at least one buried dielectric material layer 14 and isolates the various non-contiguous first conductivity type semiconductor regions from each other. Cavity 52 may have at least one sidewall that is vertical coincident with at a sidewall edge of the patterned SOI layer 16' within the first and second active device regions 20, 22. As shown, each active device region 20, 22 is vertically offset from the cavity 52. That is, no portion of the active device regions 20, 22 extends directly above the cavity 52. In some cases, a sidewall edge of at least one of the active device regions 20, 22 is vertically coincident with a sidewall surface of the cavity 52.

It is noted that when etching is employed to remove a portion of the semiconductor base layer 12 from the structure this step can be omitted since the etching can selectively remove portions of the semiconductor base layer stopping on the non-contiguous first conductivity type semiconductor regions 18L, 18R and a surface of the at least one buried dielectric material layer 14.

When spalling or planarization is used however, an isotropic etching process can be used to remove a remaining portion of the spalled semiconductor base layer 12' so as to provide the structure shown in FIG. 7. In one embodiment, the isotropic etching process may include utilizing TMAH (tetramethylammonium hydroxide), KOH or a combination thereof.

In some embodiments and when spalling was performed, the optional metal-containing adhesion layer, optional plating seed layer, the stressor layer 46 and the optional flexible handle layer can now be removed. The stressor layer 46, and, if present the optional flexible handle layer, the optional plating seed layer and the optional metal-containing adhesion layer can be removed utilizing conventional techniques well known to those skilled in the art. For example, and in one embodiment, aqua regia ($HNO_3$/HCl) can be used for removing the stressor layer 46, the optional plating seed layer and the optional metal-containing adhesion layer. In another example, UV or heat treatment is used to remove the flexible handle layer, followed by a chemical etch to remove the stressor layer 46, followed by a different chemical etch to remove the optional plating seed layer and optional metal-containing adhesion layer.

Figure 8:
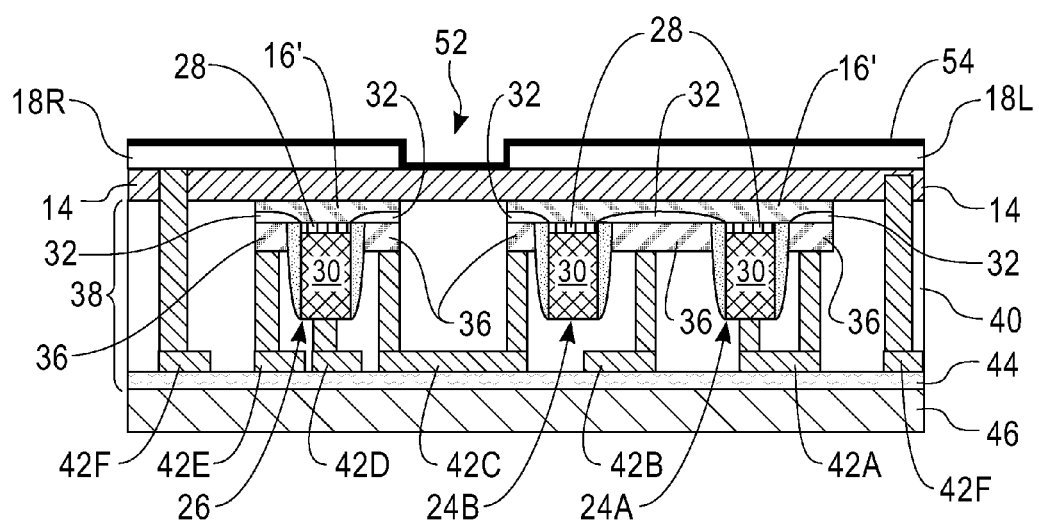
FIG. 8 is a pictorial representation (through a cross sectional view) illustrating the structure of FIG. 7 after forming a handle substrate on an exposed uppermost surface of the interconnect dielectric structure.

After removing the optional metal-containing adhesion layer, optional plating seed layer, the stressor layer 46 and the optional flexible handle layer from the structure, exposed portions of the interconnect structure 38 can be bonded to a handle substrate 50, such as is shown, in FIG. 8. The handle substrate 50 can be any material including for example, glass, and a semiconductor material.

In some embodiments, a passivation layer including, for example, silicon dioxide, silicon nitride, silicon oxynitride, and/or a high k dielectric material, can be used to electrically isolate the cavity 52. In one example, a passivation layer 54, such as also shown in FIG. 8, can be formed on the exposed surfaces of each of the non-contiguous first conductivity type semiconductor regions 18R, 18L, along the sidewalls of the cavity 52 and, optionally, on exposed surface of the at least one buried dielectric material layer 14.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   at least one buried dielectric material layer having a first surface and a second surface opposing said first surface;
   non-contiguous first conductivity type semiconductor regions located on said first surface of said at least one buried dielectric material layer, wherein a cavity is present between each non-contiguous first conductivity type semiconductor region;
   at first active device region and a second active device region located on said second surface of said at least one buried dielectric material layer, wherein said first and second active device regions are isolated from each other and are vertically offset from said cavity; and
   a first transistor located within said first active device region and a second transistor located within said second active device region.

2. The semiconductor structure of claim 1, further comprising a passivation layer located on an exposed surface of each of said non-contiguous first conductivity type semiconductor regions.

3. The semiconductor structure of claim 2, wherein a portion of said passivation layer extends along sidewalls of said cavity and atop an exposed surface of said at least one buried dielectric material layer.

4. The semiconductor structure of claim 1, further comprising an interconnect structure straddling each of said first and second transistors.

5. The semiconductor structure of claim 4, wherein said interconnect structure comprises metal contacts embedded within a dielectric material, wherein some of the metal contacts provide an electrically connection between the first and second transistors.

6. The semiconductor structure of claim 5, wherein other metal contacts extend to a surface of said non-contiguous first conductivity type semiconductor regions.

7. The semiconductor structure of claim 4, further comprising a handle substrate located on an exposed surface of said interconnect structure.

8. The semiconductor structure of claim 1, wherein each of said first and second active device regions comprises a semiconductor-on-insulator layer.

9. The semiconductor structure of claim 8, wherein said semiconductor-on-insulator layer has a thickness from 2 nm to 30 nm.

10. The semiconductor structure of claim 9, wherein said semiconductor-on-insulator layer comprises single crystalline silicon.

11. The semiconductor structure of claim 10, wherein said semiconductor-on-insulator layer contains Ge or C atoms.

* * * * *